United States Patent
Tu et al.

(10) Patent No.: US 10,510,552 B2
(45) Date of Patent: Dec. 17, 2019

(54) HARD MASK REMOVAL METHOD

(71) Applicant: Taiwan Semiconductor Manufacturing Company Limited, Hsinchu (TW)

(72) Inventors: Che-Hao Tu, Hsinchu (TW); William Weilun Hong, Hsinchu (TW); Ying-Tsung Chen, Hsinchu (TW)

(73) Assignee: Taiwan Semiconductor Manfacturing Company, Ltd., Hsinchu (TW)

( * ) Notice: Subject to any disclaimer, the term of this patent is extended or adjusted under 35 U.S.C. 154(b) by 20 days.

(21) Appl. No.: 15/957,998

(22) Filed: Apr. 20, 2018

(65) Prior Publication Data
US 2018/0240679 A1  Aug. 23, 2018

Related U.S. Application Data (62) Division of application No. 13/958,661, filed on Aug. 5, 2013, now Pat. No. 9,960,050.

(51) Int. Cl.
| | |
|---|---|
| *H01L 21/3105* | (2006.01) |
| *H01L 21/306* | (2006.01) |
| *H01L 21/8234* | (2006.01) |
| *H01L 21/3213* | (2006.01) |
| *H01L 21/28* | (2006.01) |

(52) U.S. Cl.
CPC .. *H01L 21/31053* (2013.01); *H01L 21/30625* (2013.01); *H01L 21/823437* (2013.01); *H01L 21/823456* (2013.01); *H01L 21/28123* (2013.01); *H01L 21/32139* (2013.01)

(58) Field of Classification Search
CPC ....... H01L 21/31053; H01L 21/823456; H01L 21/823437; H01L 21/32139

USPC .................................................. 438/692, 694
See application file for complete search history.

(56) References Cited

U.S. PATENT DOCUMENTS

| | | |
|---|---|---|
| 6,207,985 B1 | 3/2001 | Walker |
| 6,315,634 B1 | 11/2001 | Jensen et al. |
| 7,413,992 B2 | 8/2008 | Tan et al. |
| 8,361,338 B2 | 1/2013 | Wang |
| 2001/0039101 A1 | 11/2001 | Wenski |
| 2002/0048886 A1 | 4/2002 | Nakamura |
| 2005/0064719 A1* | 3/2005 | Liu ........................... G03F 7/40 438/725 |
| 2005/0089765 A1 | 4/2005 | Tsai et al. |
| 2006/0014360 A1 | 1/2006 | Matsumoto |
| 2008/0124862 A1 | 5/2008 | Shiratake |

(Continued)

OTHER PUBLICATIONS

LaPedus, "Applied flow in the flowable CVD" via https://www.eetimes.com/document.asp?doc_id=1257203 ; EE times; pp. 1-2; Aug. 24, 2010.*

(Continued)

*Primary Examiner* — Binh X Tran
(74) *Attorney, Agent, or Firm* — Slater Matsil, LLP (57) ABSTRACT

A method of removing a hard mask is provided. Gate stacks are patterned on a substrate, where the gate stacks include a polysilicon layer and the hard mask deposited over the polysilicon layer. A dielectric layer is deposited on the substrate and on the patterned gate stacks. A first portion of the dielectric layer is planarized by chemical mechanical polishing (CMP) to remove a topography of the dielectric layer. The hard mask and a second portion of the dielectric layer are removed by the CMP.

20 Claims, 7 Drawing Sheets

(56) References Cited

U.S. PATENT DOCUMENTS

| | | |
|---|---|---|
| 2010/0048007 A1* | 2/2010 | Lee .................. B24B 37/042 |
| | | 438/585 |
| 2010/0065900 A1 | 3/2010 | Murata et al. |
| 2010/0109064 A1 | 5/2010 | Shiratake |
| 2011/0291243 A1 | 12/2011 | Seamons et al. |
| 2012/0181612 A1 | 7/2012 | Yang et al. |
| 2012/0256276 A1 | 10/2012 | Hwang et al. |
| 2013/0164930 A1 | 6/2013 | Tu et al. |
| 2014/0252487 A1* | 9/2014 | Stephens ................ G06F 21/75 |
| | | 257/368 |

OTHER PUBLICATIONS

Lai, Jiun-Yu; Ch. 3, Mechanisms of Material Removal in the CMP Process; Doctoral Dissertation, Massachusetts Institute of Technology; pp. 75-132; Feb. 2001.

LaPedus, Applied flows into flowable CVD, Aug. 24, 2010, EE Times.

Bohr, Silicon technology for 32 nm and beyond system-on-chip products, 2009, Intel, IDF2009.

Fair, Rapid thermal processing science and technology, 1993, Academic Press Limited.

\* cited by examiner

HARD MASK REMOVAL METHOD

CROSS-REFERENCE TO RELATED APPLICATIONS

This application is a divisional under 35 U.S.C. § 121 of U.S. patent application Ser. No. 13/958,661, filed Aug. 5, 2013 and entitled "Hard Mask Removal Method," the entire contents of which are incorporated by reference herein.

TECHNICAL FIELD

The technology described in this disclosure relates generally to hard mask removal for fabrication of integrated circuits (ICs) and more particularly to removal of a hard mask deposited over a polysilicon layer of a gate structure.

BACKGROUND

The semiconductor integrated circuit (IC) industry has experienced rapid growth. Technological advances in IC manufacturing and design have produced generations of ICs where each generation has smaller and more complex circuits than the previous generation. Such advances have increased the complexity and challenges of fabricating the ICs. In IC fabrication or processing, a hard mask is used to protect against loss of unintended materials on a substrate during an etching process. To pattern gate structures including a polysilicon layer, a hard mask is deposited over the polysilicon layer to prevent against loss of the polysilicon layer during the etching process. The hard mask is removed after processing (e.g., processing that may include, for example, a patterning etch, an implantation, wet cleaning, etc.) to allow the polysilicon layer to either become polycide (for a polysilicon gate) or to be replaced by another conductive metal (for a replacement gate).

SUMMARY

The present disclosure is directed to a method of removing a hard mask. In a method of removing a hard mask, gate stacks are patterned on a substrate, where the gate stacks include a polysilicon layer and the hard mask deposited over the polysilicon layer. A dielectric layer is deposited on the substrate and on the patterned gate stacks. A first portion of the dielectric layer is planarized by chemical mechanical polishing (CMP) to remove a topography of the dielectric layer. The hard mask and a second portion of the dielectric layer are removed by the CMP.

In another method of removing a hard mask, gate stacks are patterned on a substrate, where the gate stacks include a polysilicon layer and the hard mask deposited over the polysilicon layer. The gate stacks are patterned in an isolated region and a dense region, and gate stacks of the isolated region have lower thicknesses than gate stacks of the dense region. A dielectric layer is deposited on the substrate and on the patterned gate stacks, where the dielectric layer is deposited to a greater thickness over the isolated region. The greater thickness causes the dielectric layer to have a topographical feature of a thickness within a range of approximately 0 Å to 1000 Å over the isolated region. A first portion of the dielectric layer is planarized by chemical mechanical polishing (CMP) to remove a topography of the dielectric layer. Removing the topography includes removal of the topographical feature over the isolated region. The hard mask and a second portion of the dielectric layer are removed by the CMP, where a topography difference between the isolated region and the dense region is less than 30 Å after the removing of the hard mask and the second portion.

In another method of removing a hard mask, gate stacks are patterned on a substrate, where the gate stacks include a polysilicon layer and the hard mask deposited over the polysilicon layer. The gate stacks are patterned in a dense region and in an isolated region. A dielectric layer is deposited on the substrate and on the patterned gate stacks using a flowable chemical vapor deposition (FCVD) process, where the deposited dielectric layer has a higher loading in the isolated region. A first portion of the dielectric layer is planarized by chemical mechanical polishing (CMP) to remove a topography of the dielectric layer. The hard mask and a second portion of the dielectric layer are removed by the CMP, where following the removing of the hard mask and the second portion of the dielectric layer, a third portion of the dielectric layer having a thickness within a range of approximately 150 Å to 1000 Å remains on the substrate.

DETAILED DESCRIPTION

Figure 1:
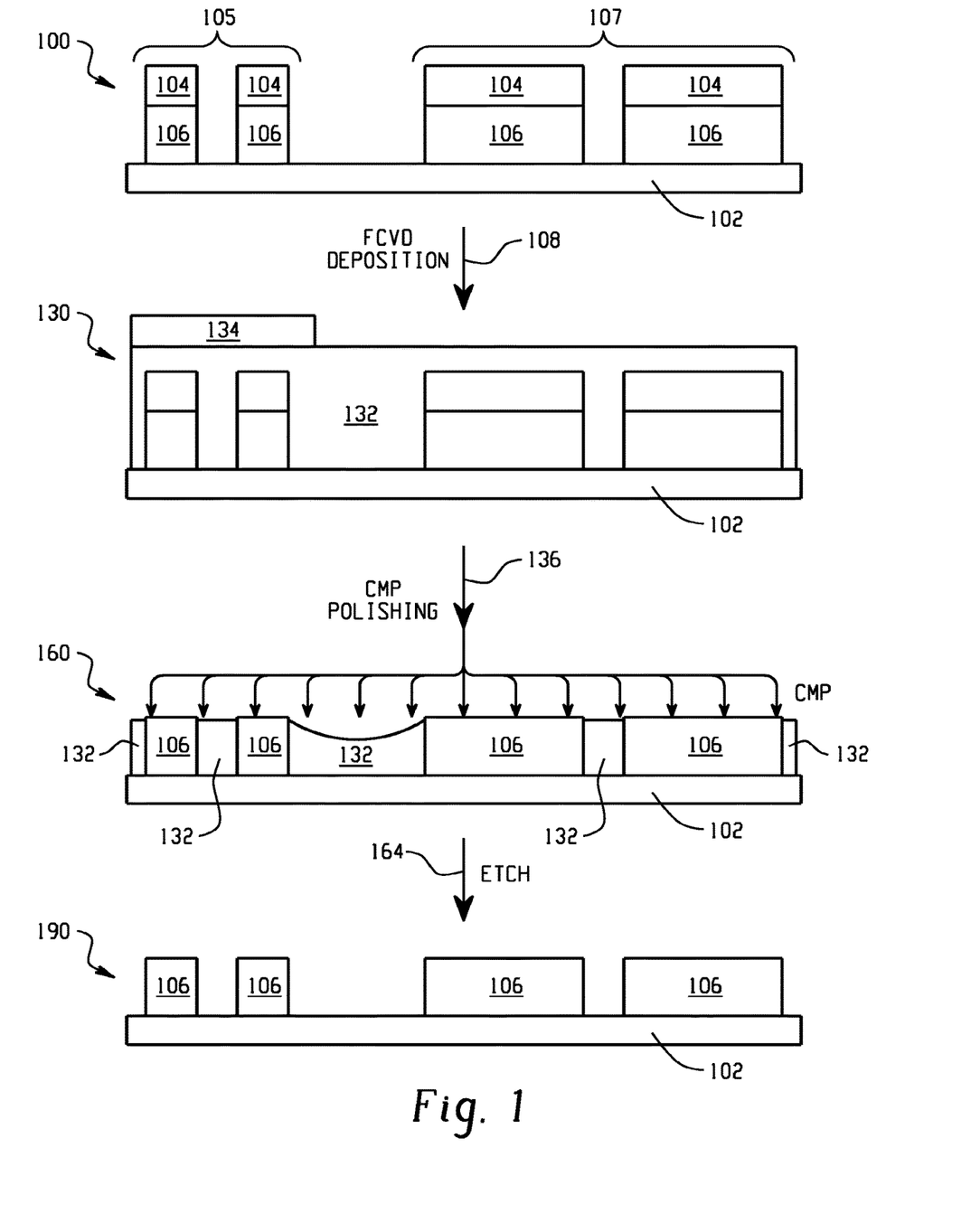
FIG. 1 depicts a series of steps used in substantially removing a hard mask layer that has been deposited over a polysilicon layer of a gate stack.

FIG. 1 depicts a series of steps used in substantially removing a hard mask layer 104 that has been deposited over a polysilicon layer 106 of a gate stack. At 100, FIG. 1 illustrates a plurality of gate stacks deposited on a substrate 102, where each gate stack of the plurality of gate stacks includes the hard mask layer 104 and the polysilicon layer 106. The polysilicon layer 106 of the gate stacks may be used as a gate layer (e.g., in a conventional polysilicon over dielectric gate stack) or as a dummy layer (i.e., a replacement gate), where the dummy layer is replaced with a metal in a later processing step. On top of the polysilicon layer 106 is the hard mask layer 104, which may be used with photoresist to pattern the gate stacks depicted in FIG. 1 (e.g., the hard mask 104 may be patterned using photoresist to open windows in the hard mask 104, where the opened windows of the hard mask 104 allow a desired pattern to be transferred to the underlying polysilicon layer 106). The hard mask layer 104 may be comprised of an oxide, a nitride, or a combination of an oxide and a nitride (e.g., a dual-layer hard mask). In some examples, the hard mask 104 is comprised of SiO$_2$, SiCO, SiC, or SiON. The gate stacks of FIG. 1 may include various other layers that are not depicted (e.g., a barrier layer, nitride spacers surrounding the gate stacks, or a workfunction layer for replacement gates).

The gate stacks depicted at 100 of FIG. 1 may be included in an isolated region 105 and a dense region 107. The isolated region 105 may include gate stacks having smaller pattern features as compared to the gate stacks of the dense region 107 (i.e., the gate stacks in the isolated region 105 may include features with narrower line widths as compared to the gate stacks in the dense region 107). Further, the gate stacks of the isolated region 105 may have lower thicknesses than the gate stacks of the dense region 107. The varying feature sizes of the isolated region 105 as compared to the dense region 107 may result in various loading effects. For example, a loading effect may cause an etch rate (e.g., an etch rate of a reactive ion etching (RIE) process) to be dependent on the area on the wafer in which the etch is occurring. The etch rate in the isolated region 105 may be significantly different from the etch rate in the dense region 107. As another example, a loading effect may cause a deposition process to deposit thicker over the isolated region 105 as compared to the dense region 107.

In order to remove the hard mask layer 104 from the gate stacks, a flowable chemical vapor deposition (FCVD) process 108 may be performed. At 130, FIG. 1 illustrates the plurality of gate stacks substantially covered with a dielectric layer 132. The dielectric layer 132, deposited via the FCVD process 108, may be substantially deposited over the substrate 102 and over the plurality of gate stacks. The dielectric 132 may have a higher loading over gate stacks patterned in the isolated region 105, as compared to the gate stack patterned in the dense region 107 (i.e., the dielectric 132 may deposit thicker over the isolated region 105). The higher loading over the isolated region 105 may be a result of the smaller pattern features of the gate stacks in the isolated region 105. The higher loading in the region 105 may cause the dielectric layer 132 deposited over the isolated region 105 to have a topographical feature 134 with a thickness.

As a next step in removing the hard mask layer 104 from the gate stacks, a chemical mechanical polishing or chemical mechanical planarization (CMP) process 136 may be performed. At 160, FIG. 1 illustrates the plurality of gate stacks following the CMP process 136. As shown at 160, the CMP process 136 may substantially remove the topographical feature 134 of the dielectric layer 132, other portions of the dielectric layer 132, and the entirety of the hard mask layer 104. The portions of the polysilicon layer 106 remaining after the CMP process 136 may be of a same thickness or of similar thicknesses (i.e., considering only the portions of the polysilicon layer 106 left on the substrate 102, a planar surface or an approximately planar surface is formed by the CMP process 136). As described above, gate stacks patterned in the dense region 107 may have thicknesses (i.e., heights) that are greater than those of the gate stacks patterned in the isolated region 105. The greater thicknesses of the gate stacks patterned in the dense region 107 may cause the CMP process 136 to reach the hard mask layer 104 for these gate stacks prior to a time in which the CMP process 136 reaches the hard mask layer 104 for the gate stacks patterned in the isolated region 105. The CMP process 136 may be configured to substantially remove the materials of the isolated region 105 and the materials of the dense region 107 at a same rate or an approximately same rate. Thus, the CMP process 136 may be designed to be non-selective, such that the CMP process 136 removes the dielectric layer 132 at the same rate as the hard mask layer 104 and also such that the removal rate does not vary between the isolated and dense regions 105, 107. Due to the same rate or the approximately same rate of material removal in the different regions 105, 107, a planar or approximately planar structure may be maintained throughout the CMP process 136.

An etch process 164 may be used to substantially remove portions of the dielectric layer 132 that remain on the substrate 102 following the CMP polishing 136. The etch process 164 may be a dry etch (e.g., a reactive ion etch (RIE)) or a wet etch (e.g., a buffered hydrofluoric acid etch). As illustrated at 190 of FIG. 1, after the CMP polishing 136 and the etch process 164, only the polysilicon layer 106 portions of the gate stacks may remain on the substrate 102, and the hard mask layer 104 and the dielectric layer 132 may be substantially removed. In substantially removing the hard mask layer 104, a photolithography process may not be used. Further, by using the CMP polishing 136 in the manner illustrated in FIG. 1, an etch procedure may not be used in the removal of the hard mask layer 104 (i.e., the etch procedure 164 illustrated in FIG. 1 may be used only to remove portions of the dielectric layer 132 after all portions of the hard mask layer 104 are substantially removed).

Figure 2A:
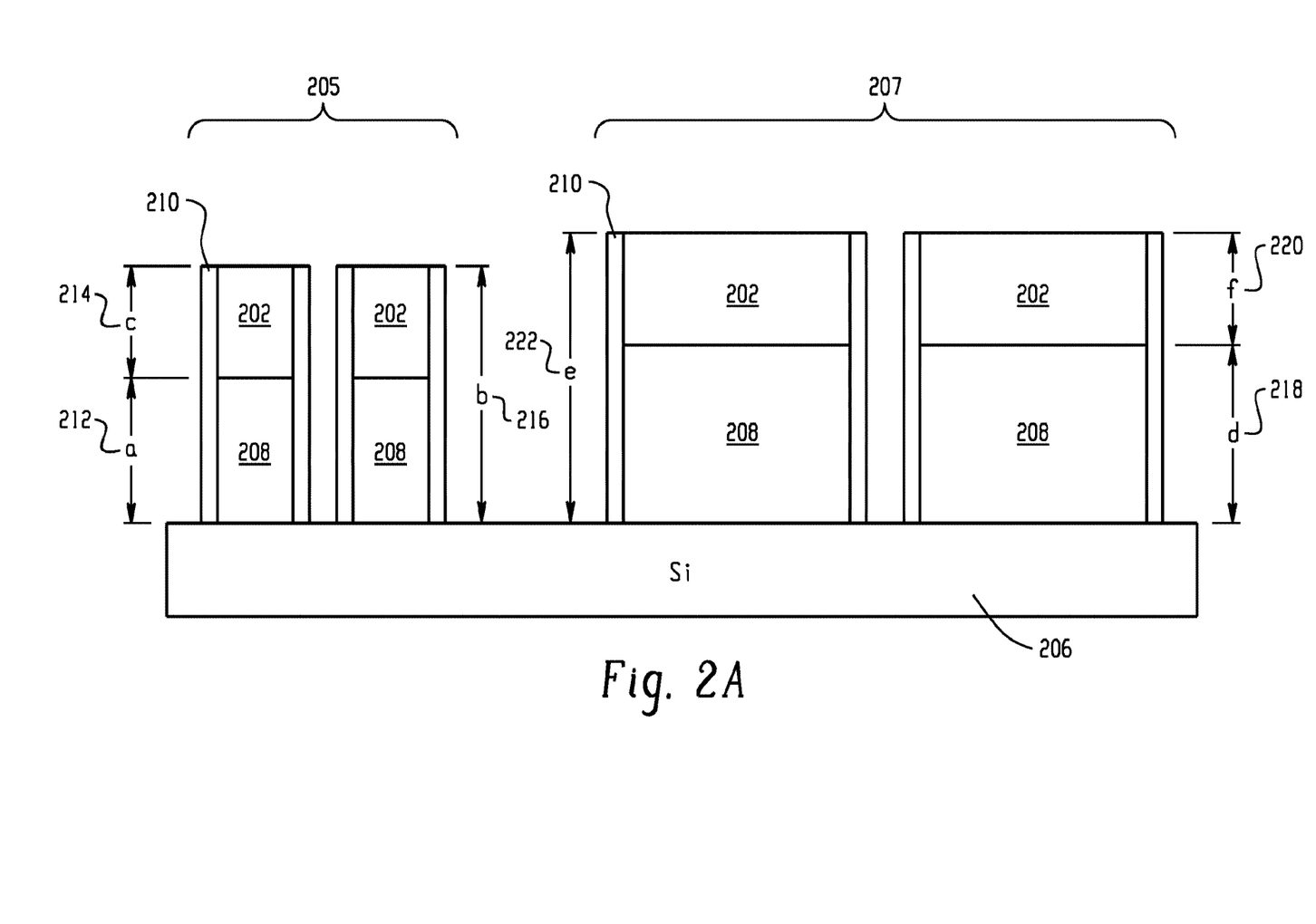
FIG. 2A depicts gate stacks patterned in an isolated region and gate stacks patterned in a dense region on a silicon substrate.

FIG. 2A depicts gate stacks patterned in an isolated region 205 and gate stacks patterned in a dense region 207 on a silicon substrate 206. In the dense region 207, the gate stacks may have larger pattern features as compared to the gate stacks in the isolated region 205 (i.e., the features of the dense region 207 may have wider line widths as compared to the features of the isolated region 205). Due to the different pattern densities in the isolated region 205 and the dense region 207, a dry etch or a wet etch applied to the different regions 205, 207 may have a different etch rate. It is well known in the art that an etch removal rate of a material depends on the pattern density of the material being removed, whereby smaller pattern features may require a longer etch time than larger pattern features. This effect is known as a loading effect, which is known to cause uneven etch removal rates over the surface of a substrate.

Each of the gate stacks includes a hard mask layer 202 and a polysilicon layer 208. The polysilicon layer 208 of the gate stacks may be used, for example, as a gate layer of a transistor device formed on the substrate 206. On top of the polysilicon layer 208 is the hard mask layer 202, which may be used with photoresist to pattern the gate structures depicted in FIG. 2A. The hard mask layer 202 may be comprised of an oxide, a nitride, or a combination of an oxide and a nitride (e.g., a dual-layer hard mask), among other materials. The gate stacks may be surrounded by nitride spacers 210.

In the isolated region 205, the polysilicon layer 208 has a thickness "a" 212 within a range of approximately 200 Å to 1200 Å, and the hard mask layer 202 has a thickness "c" 214 within a range of approximately 200 Å to 1500 Å. The gate stacks in the isolated region 205 have total thicknesses "b" 216, which are equal to "a"+"c." In the dense region 207, the polysilicon layer 208 has a thickness "d" 218 within a range of approximately 200 Å to 1200 Å, and the hard mask layer 202 has a thickness "f" 220 within a range of approximately 200 Å to 1500 Å. The gate stacks in the dense region 207 have total thicknesses "e" 222, which are equal to "d"+"f."

The gate stacks in the dense region 207 may be thicker than the gate stacks in the isolated region 205. Thus, the hard mask layer 202 of the dense region 207 has the thickness "f" that may be greater than the thickness "c" for the hard mask layer 202 of the isolated region 205, with the difference "f"–"c" being within a range of approximately 100 Å to 800 Å (i.e., 100 Å<"f"–"c"<800 Å). Similarly, the polysilicon layer 208 of the dense region 207 has the thickness "d" that may be greater than the thickness "a" for the polysilicon layer 208 of the isolated region 205, with the difference "d"–"a" being within a range of approximately 30 Å to 250 Å (i.e., 30 Å<"d"–"a"<250 Å).

Figure 2B:
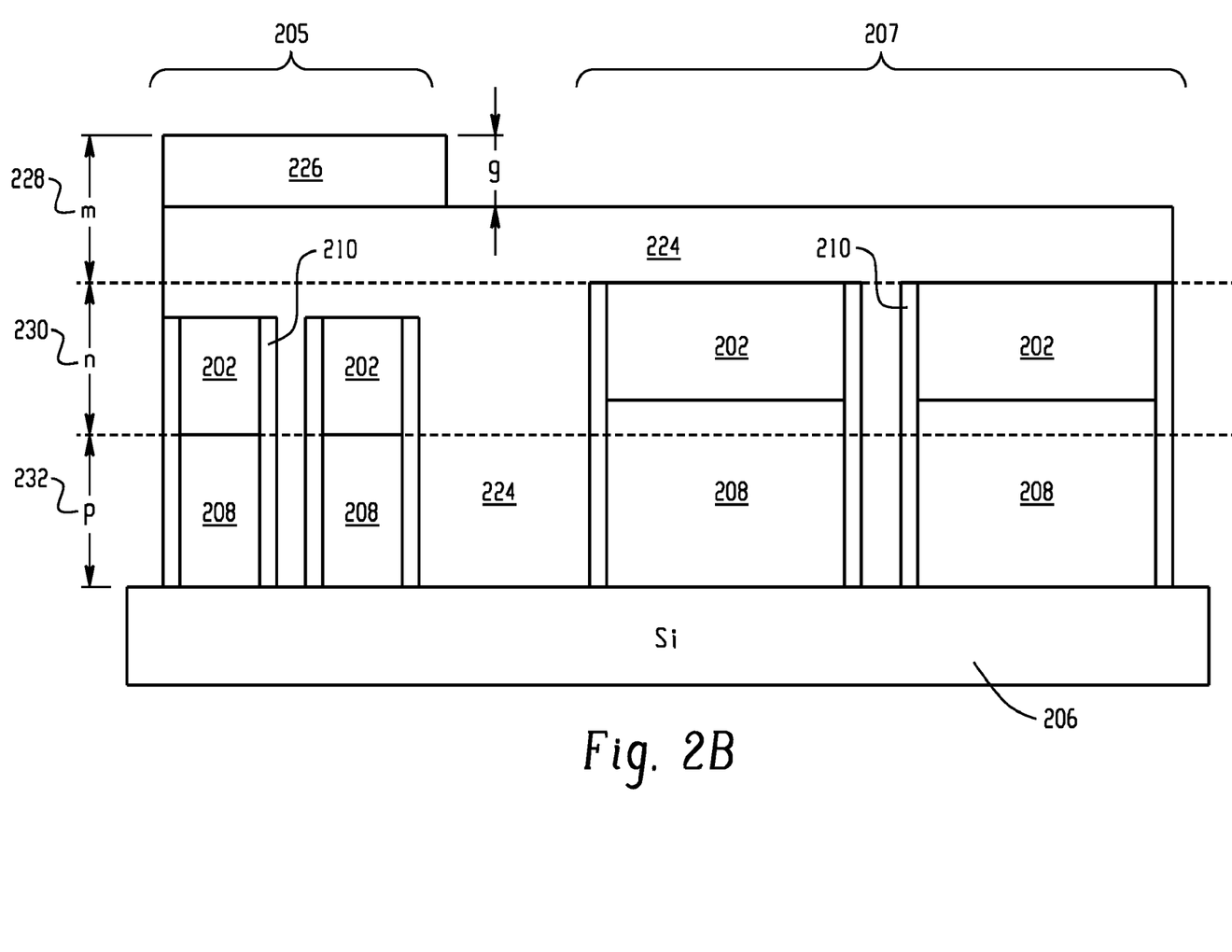
FIG. 2B depicts a deposition of a dielectric layer via a flowable chemical vapor deposition (FCVD) process.

FIG. 2B depicts a deposition of a dielectric layer 224 via a flowable chemical vapor deposition (FCVD) process. The deposition of the dielectric layer 224 via the FCVD process may begin a procedure used to substantially remove the hard mask layer 202 from the gate stacks. The dielectric layer 224 may be a flowable, sacrificial CVD oxide layer that is substantially deposited on the substrate 206 and over the patterned gate stacks. An example of a flowable CVD oxide film is Alectrona, which is a carbon-free flowable CVD silicon oxide that is offered by Applied Materials of Santa Clara, Calif. Other types of flowable CVD oxide films may be used in the example of FIG. 2B.

As described above, the gate stacks in the dense region 207 may have larger pattern features as compared to those of the isolated region 205. Due to the different pattern densities used in the isolated region 205 and the dense region 207, the dielectric layer 224 deposited via the FCVD process may have a higher loading over the isolated region 205 as compared to the dense region 207 (i.e., the dielectric layer 224 may be deposited to a greater thickness over the isolated region 205). The higher loading over the isolated region 205 may cause the dielectric layer 224 to have a topographical feature 226 over the isolated region 205, where the topographical feature 226 has a thickness "g" within a range of approximately 0 Å to 1000 Å.

In depicting a cross section of the gate stack structures after the dielectric layer 224 is deposited, FIG. 2B also depicts regions "m" 228, "n" 230, and "p" 232. As described in further detail below with respect to FIGS. 2C and 2D, a portion of the dielectric layer 224 in the region "m" 228 may be planarized via a chemical mechanical polishing or chemical mechanical planarization (CMP) process to remove the topographical features of the dielectric layer 224 (i.e., the topographical feature 226 over the isolated region 205). In planarizing the portion of the dielectric layer 224 in the region "m" 228, the CMP process may be used to substantially remove the dielectric layer 224 over the gate stacks in the dense region 207, such that the hard mask layer 202 in the dense region 207 is exposed to the CMP process. After substantially planarizing the dielectric layer 224 in the region "m" 228, the CMP process is further utilized to remove the hard mask layer 202 and a portion of the dielectric layer 224 in the region "n" 230. The remaining dielectric layer 224 in the region "p" 232 may be etched away using an etch procedure with a high selectivity compared to other materials exposed to the etching chemistry (i.e., the polysilicon layer 208 and the nitride spacers 210). The CMP removal of the hard mask layer 202 in this manner may allow the hard mask layer 202 to be substantially removed without use of photoresist or lithographical processes.

Figure 2C:
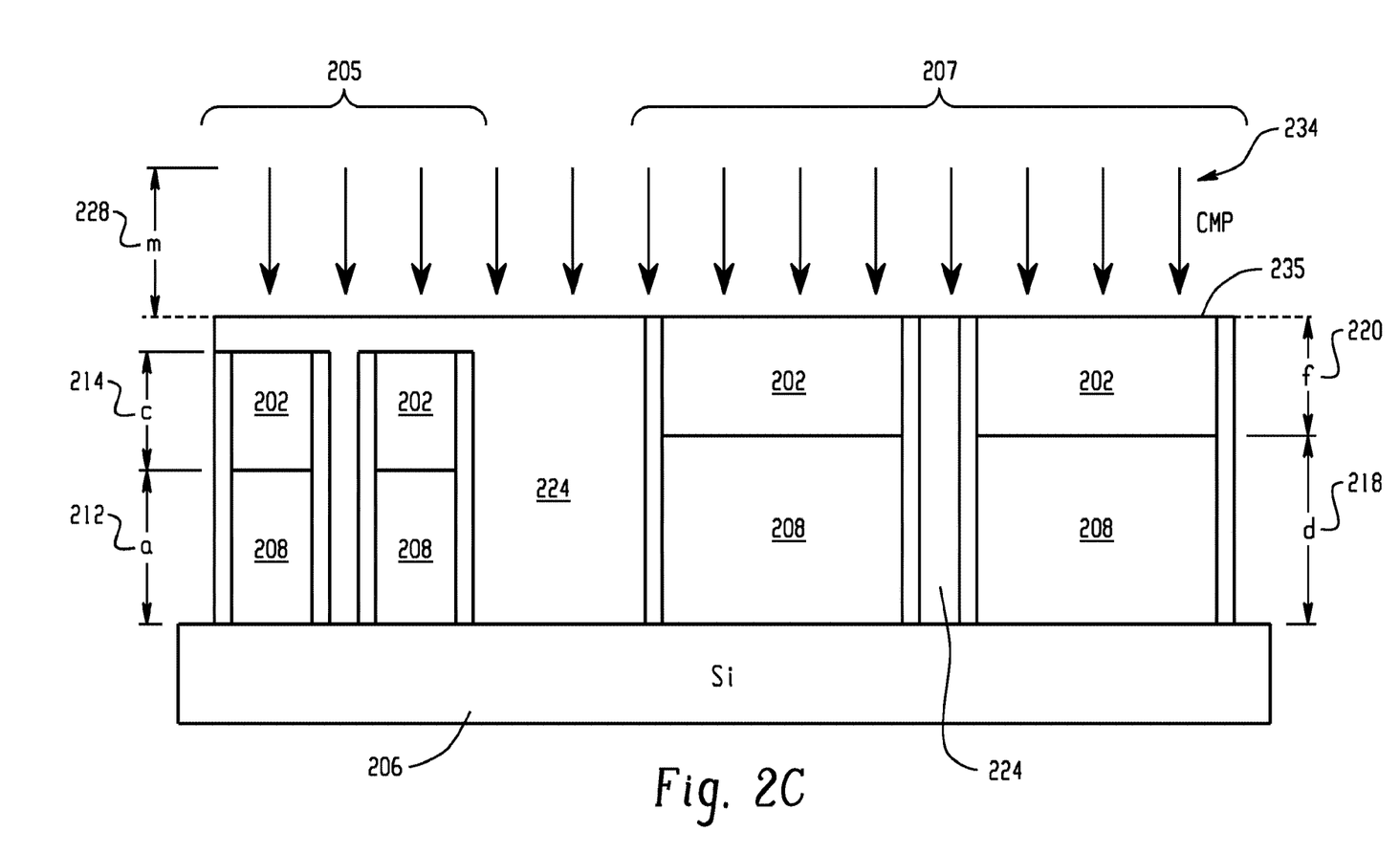
FIG. 2C depicts use of a chemical mechanical planarization or chemical mechanical polishing (CMP) process to remove a portion of a dielectric layer of a structure.

FIG. 2C depicts use of a CMP process 234 to substantially remove the portion of the dielectric layer 224 in the region "m" 228. As illustrated in FIG. 2C, the CMP process 234 may planarize the dielectric layer 224 in the region "m" 228, thus substantially removing the topographical features of the dielectric layer 224 shown in FIG. 2B (i.e., the topographical feature 226 over the isolated region 205). The gate stacks in the dense region 207 have total thicknesses, equal to "f" 220+"d" 218, that may be greater than the total thicknesses of the gate stacks in the isolated region 205, which are equal to "c" 214+"a" 212. Because of the thickness differential between the gate stacks of the two regions 205, 207, the CMP process 234 may touch a top of the hard mask layer 202 in the dense region 207 prior to a point in time in which the CMP process 234 touches a top of the hard mask layer 202 in the isolated region 205. When the top of the hard mask layer 202 in the dense region 207 is exposed to the CMP process 234, the CMP process 234 may begin to remove portions of the hard mask layer 202 in this region 207. As depicted in FIG. 2C, while the hard mask layer 202 of the dense region 207 is being polished by the CMP process 234, the dielectric layer 224 over the gate stacks of the isolated region 205 may continue to be polished (i.e., the hard mask layer 202 of the dense region 207 may be polished contemporaneously with the polishing of the dielectric layer 224 of the isolated region 205).

A planar surface 235 formed as a result of the CMP process 234 may include an area of the hard mask layer 202 (i.e., a top surface of the hard mask layer 202 in the dense region 207) and an area of the dielectric layer 224 (i.e., a top surface of the dielectric layer 224 that remains over the gate stacks in the isolated region 205). In one example, the isolated region 205 and the dense region 207 may be exposed to the CMP process 234 for different amounts of time, such that a loading effect of the structure may be reduced via the CMP process 234 (i.e., the CMP process 234 causes a planer or an approximately planar structure to be produced). In the example of FIG. 2C, materials (e.g., a chemical slurry) and process parameters may be selected to cause a non-selective removal of the materials of the isolated and dense regions 205, 207. The non-selective removal of the materials may cause the dielectric layer 224 and the hard mask layer 202 to be removed by the CMP process 234 at a same rate or at similar rates. The selection of the materials and the process parameters for the CMP process 234 in this manner may also enable material to be removed evenly between the isolated and dense regions 205, 207, such that no loading effect may be observed with respect to the removal of materials via the CMP process 234 (i.e., the varying pattern densities and line widths for features of the gate stacks in the different regions 205, 207 may not affect a rate of material removal via the CMP process 234). In other examples, however, the CMP process 234 removes the materials of the dielectric layer 224 and the hard mask layer 202 at different rates. Further, in other examples, the material removal rate of the CMP process 234 is dependent on whether the material being removed is included in the isolated region 205 or the dense region 207.

Figure 2D:
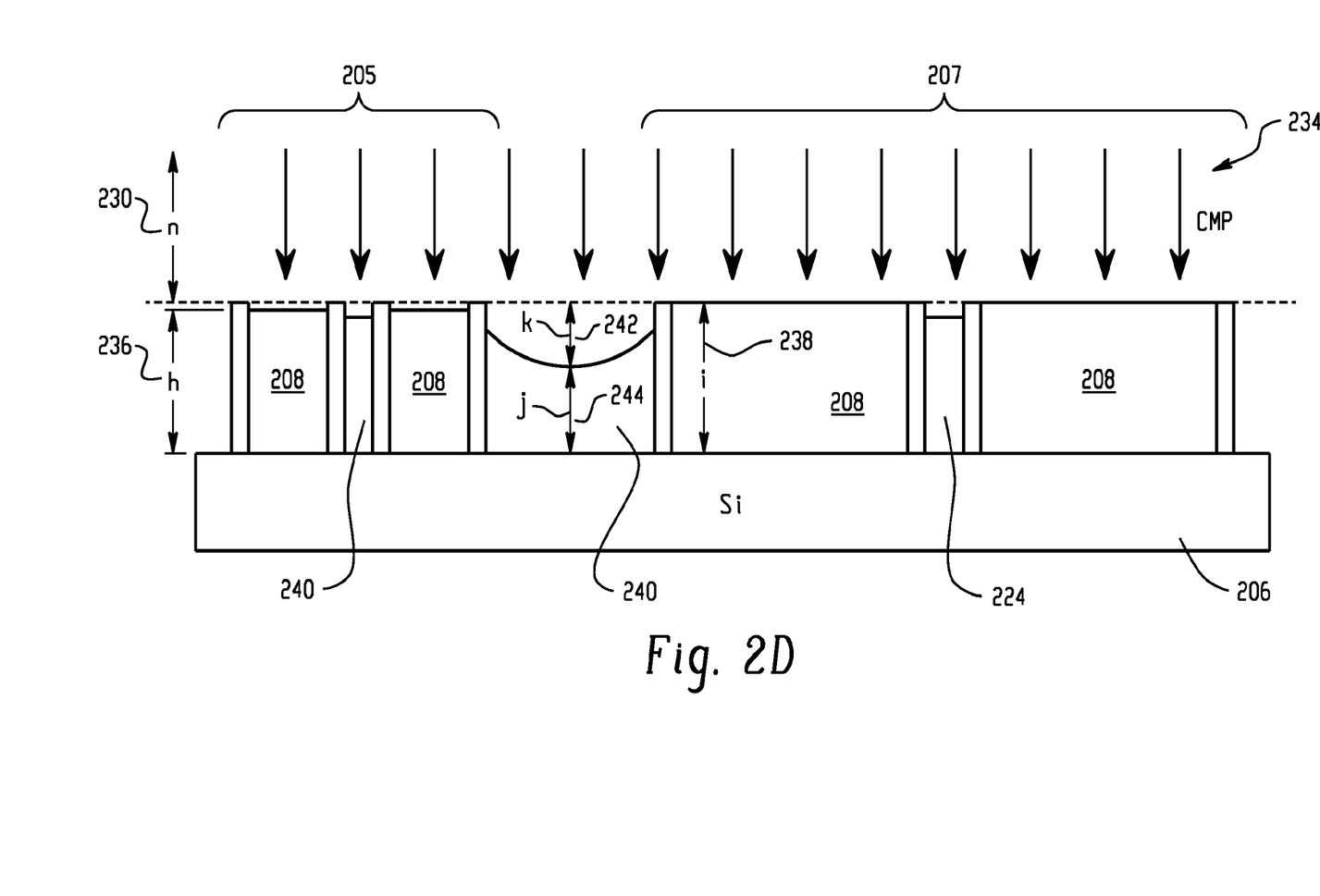
FIG. 2D depicts use of a CMP process to substantially remove portions of a dielectric layer and a hard mask layer of a structure.

FIG. 2D depicts use of the CMP process 234 to substantially remove the portions of the dielectric layer 224 and the hard mask layer 202 in the region "n" 230. The state of the structure depicted in FIG. 2D shows the structure at the completion of the CMP process 234, with the hard mask layer 202 substantially removed by the CMP process 234. In the dense region 207, after the hard mask 202 is substantially removed via the CMP process 234, the CMP process 234 may thereafter begin to remove portions of the polysilicon layer 208 in the dense region 207. While the CMP process 234 is removing the portions of the polysilicon layer 208 in the dense region 207, the CMP process 234 may be contemporaneously removing portions of the hard mask layer 202 in the isolated region 205.

When the hard mask layer 202 has been substantially removed from the isolated region 205, the CMP process 234 may be stopped. Despite the fact that the polysilicon layer 208 in the dense region 207 originally had the thickness "d"

218 that may have been greater than the thickness "a" 212 of the polysilicon layer 208 of the isolated region 205 (as explained above with reference to FIG. 2C), the thicknesses of the portions of the polysilicon layer 208 in the different regions 205, 207 may be equal or approximately equal at the completion of the CMP process 234. This is because portions of the polysilicon layer 208 in the dense region 207 may be removed prior to the time in which the CMP process 234 is stopped. The polysilicon layer 208 of the dense region 207 may thus be polished for a greater amount of time as compared to the polysilicon layer 208 of the isolated region 205. In one example, the polysilicon layer 208 of the isolated region 205 is polished for a small amount of time that is after the hard mask layer 202 is substantially removed in the isolated region 205 and before the CMP process 234 is stopped.

Because of the differential in polishing times for the portions of the polysilicon layer 208 of the different regions 205, 207, a difference between a thickness "i" 238 of the polysilicon layer 208 in the dense region 207 and a thickness "h" 236 of the polysilicon layer 208 in the isolated region 205 may be within a range of approximately 0 Å to 30 Å (i.e., 0 Å<"i"–"h"<30 Å). After substantial removal of the hard mask layer 202 via the CMP process 234 in this manner, the thickness "i" 238 of the polysilicon layer 208 in the dense region 207 may be within a range of approximately 200 Å to 1000 Å, and the thickness "h" of the polysilicon layer 208 in the isolated region 205 may be within a range of approximately 200 Å to 1000 Å. A dishing "k" value 242 relating to transistor pitch shrink may be within a range of approximately 0 Å to 50 Å. A portion 240 of the dielectric layer 224 remaining on the substrate 206 after the CMP process 234 may have a thickness "j" 244 that is within a range of approximately 150 Å to 1000 Å.

Figure 2E:
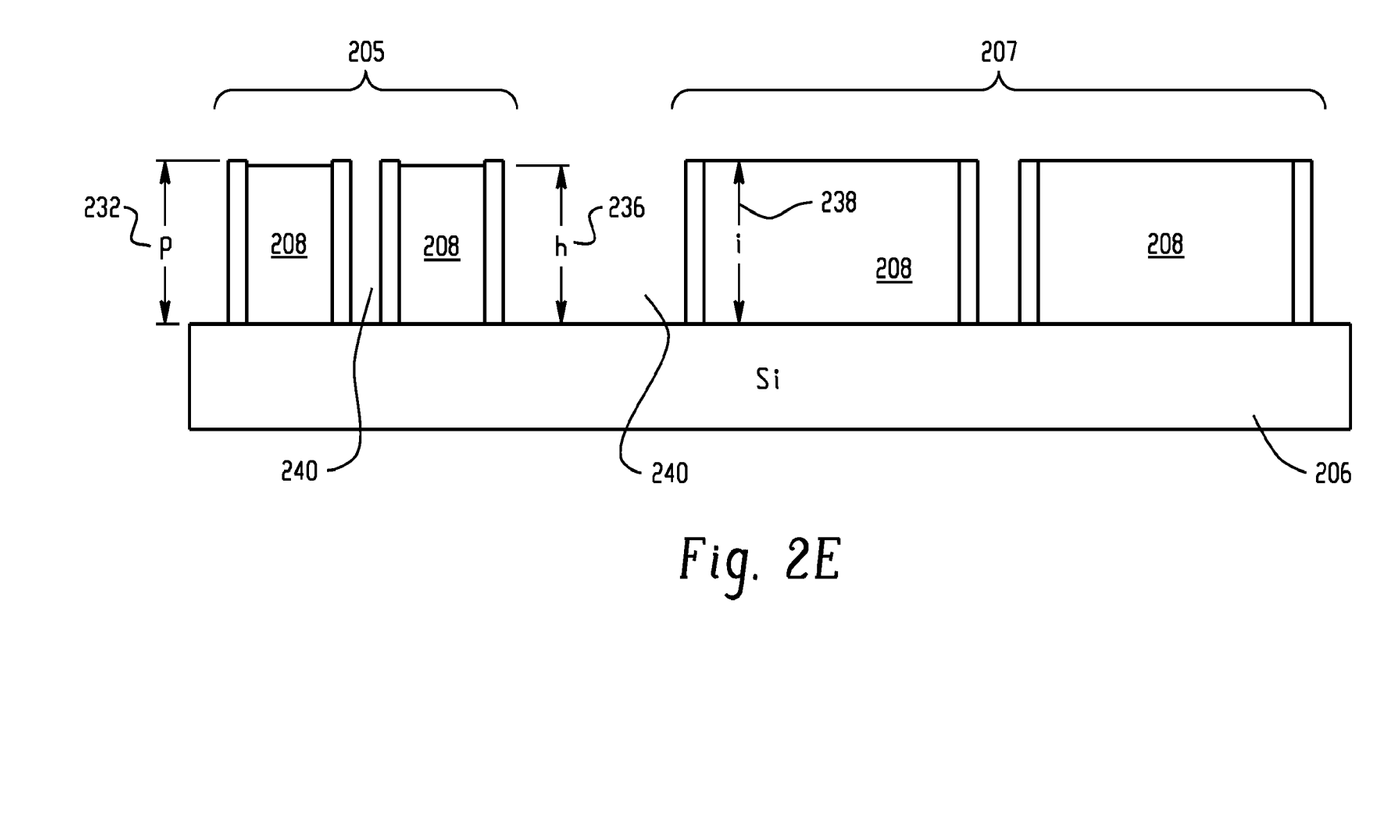
FIG. 2E depicts a final structure after removal of a remaining portion of a dielectric layer.

FIG. 2E depicts a final structure after substantial removal of the remaining portion 240 of the dielectric layer 224. To achieve the final structure depicted in FIG. 2E, the remaining portion 240 of the dielectric layer 224 in the region "p" 232 may be etched away using an etch procedure. The etch procedure may be one having a high selectivity, such that the material of the dielectric layer 224 may be removed at a high rate as compared to the removal rate of other materials exposed to the etching chemistry (i.e., the polysilicon layer 208 and the nitride spacers 210). The high selectivity of the etch procedure may allow for minimal loss of the polysilicon layer 208, and the thicknesses "h" 236 and "i" 238 may both remain within a range of approximately 200 Å to 1000 Å, as the thicknesses 236, 238 were prior to the etch procedure. In the final structure, the difference between the thickness "i" 238 of the polysilicon layer 208 in the dense region 207 and the thickness "h" 236 of the polysilicon layer 208 in the isolated region 205 may be within a range of approximately 0 Å to 30 Å (i.e., 0 Å<"i"–"h"<30 Å). In the final structure, the gate stacks may be patterned to have a pitch within a range of approximately 20 nm to 1 μm, and the gate stacks may have an aspect ratio greater than approximately 2.

Figure 3:
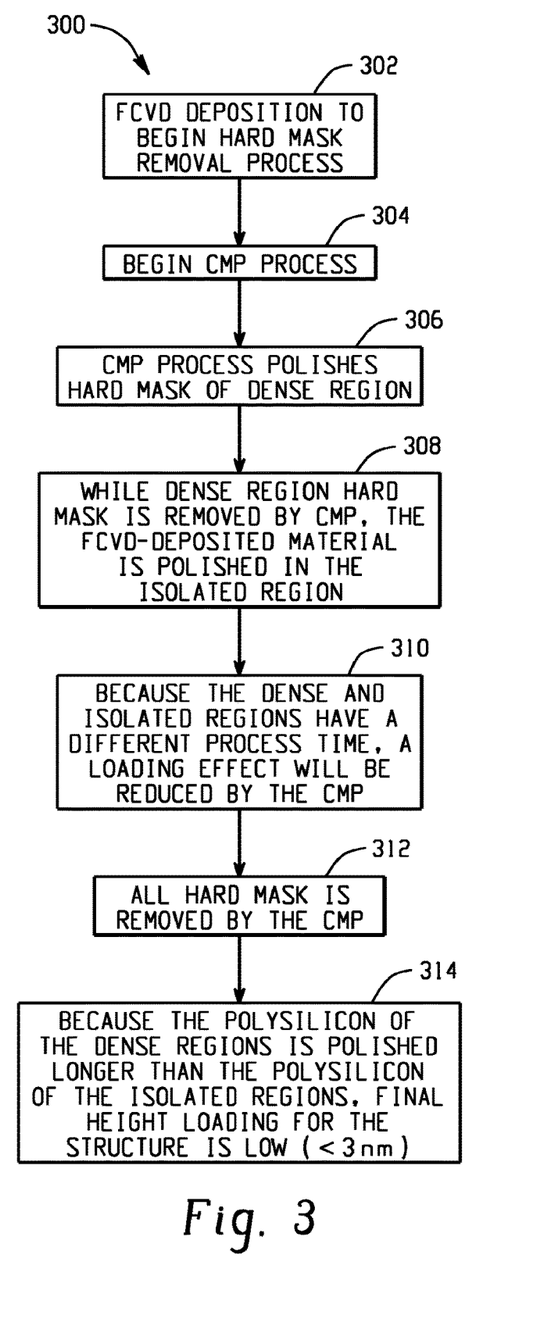
FIG. 3 is a flowchart illustrating an example method of substantially removing a hard mask using a chemical mechanical planarization (CMP) process.

FIG. 3 is a flowchart 300 illustrating an example method of substantially removing a hard mask using a chemical mechanical planarization (CMP) process. At 302, the hard mask removal process may begin with a flowable chemical vapor deposition (FCVD) to deposit a dielectric layer. The dielectric layer is deposited substantially over a substrate and gate stacks patterned on the substrate, where the gate stacks may include a polysilicon layer and the hard mask deposited substantially over the polysilicon layer. Due to varying pattern densities of the gate stacks patterned in different regions of the substrate (i.e., gate stacks patterned in a dense region and gate stacks patterned in an isolated region), the FCVD deposition may deposit the dielectric layer at greater thicknesses in certain areas of the substrate. For example, due to properties of the FCVD deposition and the different pattern densities, the isolated region of the substrate may have a higher loading as compared to the dense region of the substrate.

At 304, the CMP process is started. The CMP process may be configured to substantially remove both the material of the dielectric layer and the material of the hard mask. At 306, the CMP process may polish the hard mask within the dense region and remove portions of the hard mask in the polishing. Contemporaneously with the polishing of the hard mask within the dense region, at 308, the CMP may polish the FCVD-deposited dielectric material in the isolated region. The hard mask of the dense region may be polished at the same time as the dielectric layer of the isolated region because the gate stacks in the dense region may be thicker than the gate stacks of the isolated region, thus allowing the CMP process to reach the hard mask of the dense region while the CMP process is still polishing the dielectric layer over the gate stacks in the isolated region. At 310, because the dense and isolated regions have different processing times, a loading effect may be reduced by the CMP process.

At 312, at the completion of the CMP process, the hard mask may be substantially removed by the CMP process. Thus, the hard mask may be removed without performing a lithography process and without performing an etching procedure. At 314, because the polysilicon of the dense regions may be polished for a longer amount of time than the polysilicon of the isolated regions, a final thickness loading for the structure may be low (i.e., the polysilicon layer in the dense region may be thicker than the polysilicon layer in the isolated region by less than 3 nm).

Figure 4:
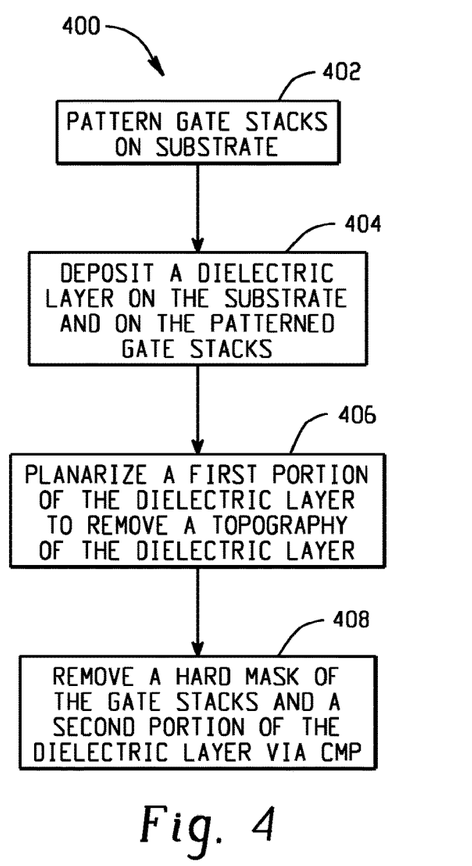
FIG. 4 is a flowchart illustrating an example method of substantially removing a hard mask.

FIG. 4 is a flowchart 400 illustrating an example method of substantially removing a hard mask. At 402, gate stacks may be patterned on a substrate. The gate stacks may include a polysilicon layer and the hard mask deposited over the polysilicon layer. At 404, a dielectric layer may be deposited substantially over the substrate and on the patterned gate stacks. At 406, a first portion of the dielectric layer may be planarized by chemical mechanical polishing (CMP) to remove a topography of the dielectric layer. At 408, the hard mask and a second portion of the dielectric layer are substantially removed by the CMP.

This written description uses examples to disclose the disclosure, including the best mode, and also to enable a person skilled in the art to make and use the disclosure. The patentable scope of the disclosure may include other examples. It should be understood that as used in the description herein and throughout the claims that follow, the meaning of "a," "an," and "the" includes plural reference unless the context clearly dictates otherwise. Also, as used in the description herein and throughout the claims that follow, the meaning of "in" includes "in" and "on" unless the context clearly dictates otherwise. Further, as used in the description herein and throughout the claims that follow, the meaning of "each" does not require "each and every" unless the context clearly dictates otherwise. Finally, as used in the description herein and throughout the claims that follow, the meanings of "and" and "or" include both the conjunctive and disjunctive and may be used interchangeably unless the context expressly dictates otherwise; the phrase "exclusive of" may be used to indicate situations where only the disjunctive meaning may apply.

It is claimed:

1. A method of removing a hard mask, the method comprising:
   patterning gate stacks on a substrate, wherein the gate stacks include a polysilicon layer and the hard mask deposited over the polysilicon layer, wherein the gate stacks are patterned in an isolated region and a dense region, and wherein gate stacks of the isolated region have lower thicknesses than gate stacks of the dense region;
   depositing a dielectric layer directly on exposed portions of the substrate between the gate stacks and on the gate stacks, wherein after the dielectric layer is deposited the dielectric layer has a first thickness in the isolated region and a second thickness in the dense region, the first thickness is greater than the second thickness, the first thickness is between a first surface of the dielectric layer that is closest to the substrate in the isolated region and a second surface of the dielectric layer that is farthest from the substrate in the isolated region, the second thickness is between a third surface of the dielectric layer that is closest to the substrate in the dense region and a fourth surface of the dielectric layer that is farthest from the substrate in the dense region, and the first surface of the dielectric layer is level with the third surface of the dielectric layer;
   planarizing a first portion of the dielectric layer by a first chemical mechanical polishing (CMP) process, wherein after the first CMP process a difference in the first thickness and the second thickness has been reduced; and
   removing the hard mask and a second portion of the dielectric layer by a second CMP process, wherein a thickness difference between the gate stacks in the isolated region and the gate stacks in the dense region is less than 30 Å after the removing of the hard mask and the second portion.

2. The method of claim 1, wherein during removing the hard mask and the second portion of the dielectric layer, the polysilicon layer of the gate stacks in the dense region is polished for a greater amount of time as compared to the polysilicon layer of the gate stacks in the isolated region.

3. The method of claim 1, wherein before the dielectric layer is deposited the polysilicon layer of the gate stacks of the isolated region is thinner than the polysilicon layer of the gate stacks of the dense region, and wherein before the dielectric layer is deposited the hard mask of the gate stacks of the isolated region is thinner than the hard mask of the gate stacks of the dense region.

4. The method of claim 1, wherein each gate stack of the isolated region has smaller pattern features in a dimension of a lateral line width than does each gate stack of the dense region.

5. The method of claim 1, wherein the depositing is executed using a flowable chemical vapor deposition (FCVD).

6. The method of claim 1, wherein the hard mask is removed without performing lithography and is removed without performing an etch procedure.

7. The method of claim 1, wherein the first CMP process and the second CMP process are continuously performed, and the first CMP process and the second CMP process remove material in the dense region and material in the isolated region at a same rate or an approximately same rate as one another.

8. The method of claim 1, further comprising:
   after removing the hard mask and the second portion of the dielectric layer, removing a remaining portion of the dielectric layer using an etch procedure.

9. The method of claim 1, wherein after the dielectric layer is deposited a difference between the first thickness and the second thickness is up to 1000 Å.

10. The method of claim 1, wherein planarizing the first portion of the dielectric layer by the first CMP process causes the hard mask of gate stacks in the dense region to be exposed.

11. The method of claim 10, wherein planarizing the first portion of the dielectric layer by the first CMP process leaves the second portion of the dielectric layer over the hard mask of gate stacks in the isolated region.

12. A method of removing a hard mask, the method comprising:
   patterning gate stacks on a substrate, wherein the gate stacks include a polysilicon layer and the hard mask deposited over the polysilicon layer, and wherein the gate stacks are patterned in a dense region and in an isolated region;
   depositing a dielectric layer directly on exposed portions of the substrate between the gate stacks and on the gate stacks using a flowable chemical vapor deposition (FCVD) process, wherein the deposited dielectric layer has a higher loading in the isolated region;
   planarizing a first portion of the dielectric layer by chemical mechanical polishing (CMP) to remove a topography of the dielectric layer;
   removing the hard mask and a second portion of the dielectric layer by the CMP, wherein following the removing of the hard mask and the second portion of the dielectric layer, a third portion of the dielectric layer having a thickness within a range of approximately 150 Å to 1000 Å remains on the substrate; and
   removing the third portion of the dielectric layer to expose the substrate between the gate stacks.

13. The method of claim 12, wherein the third portion of the dielectric layer is removed using an etch procedure.

14. A method of removing a hard mask, the method comprising:
   patterning gate stacks on a substrate, wherein the gate stacks include a polysilicon layer and the hard mask deposited over the polysilicon layer, wherein the gate stacks are patterned in a first region and a second region, at least two of the gate stacks are in the first region and at least two of the gate stacks are in the second region, and wherein the at least two of the gate stacks in the second region have lower thicknesses than the at least two of the gate stacks in the first region;
   depositing a dielectric layer directly on exposed portions of the substrate between the gate stacks and on the gate stacks, wherein after the dielectric layer is deposited a first surface of the dielectric layer overlies the first region and is farthest from the substrate in the first region, a second surface of the dielectric layer overlies the second region and is farthest from the substrate in the second region, and the second surface of the dielectric layer is farther from the substrate that the first surface of the dielectric layer;
   planarizing a first portion of the dielectric layer by chemical mechanical polishing (CMP) to completely remove the dielectric layer over the at least two of the gate stacks in the first region and to partially remove the dielectric layer over the at least two of the gate stacks in the second region; and removing the hard mask over the at least two of the gate stacks in the first region the at least two of the gate stacks in the second region and a second portion of the dielectric layer over the at least two of the gate stacks in the second region by the CMP.

15. The method of claim 14, wherein, prior to the planarizing, the polysilicon layer of the at least two of the gate stacks in the second region is thinner than the polysilicon layer of the at least two of the gate stacks in the first region, and wherein the hard mask of the at least two of the gate stacks in the second region is thinner than the hard mask of the at least two of the gate stacks in the first region.

16. The method of claim 14, wherein each gate stack of the at least two of the gate stacks in the second region has smaller pattern features in a dimension of a lateral linewidth than does each gate stack of the at least two of the gate stacks in the first region.

17. The method of claim 14, wherein the depositing is executed using a flowable chemical vapor deposition (FCVD).

18. The method of claim 14, wherein the hard mask is removed without performing lithography and is removed without performing an etch procedure.

19. The method of claim 14, further comprising:
after removing the hard mask and the second portion of the dielectric layer, removing a remaining portion of the dielectric layer using an etch procedure.

20. The method of claim 14, wherein distances between center points of adjacent gate stacks of the at least two gate stacks in the first region are greater than distances between center points of adjacent gate stacks of the at least two gate stacks in the second region.

* * * * *

UNITED STATES PATENT AND TRADEMARK OFFICE
CERTIFICATE OF CORRECTION

PATENT NO. : 10,510,552 B2  
APPLICATION NO. : 15/957998  
DATED : December 17, 2019  
INVENTOR(S) : Che-Hao Tu Page 1 of 1

It is certified that error appears in the above-identified patent and that said Letters Patent is hereby corrected as shown below:

On the Title Page

Item (73) Assignee, Line 1, delete "Manfacturing" and insert --Manufacturing--.

Signed and Sealed this  
Twenty-third Day of June, 2020

Andrei Iancu  
*Director of the United States Patent and Trademark Office*